United States Patent
Hsieh

(10) Patent No.: US 6,806,581 B2
(45) Date of Patent: Oct. 19, 2004

(54) BONDED ANISOTROPIC CONDUCTIVE FILM

(75) Inventor: Kuan-Sheng Hsieh, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 53 days.

(21) Appl. No.: 10/047,681

(22) Filed: Jan. 14, 2002

(65) Prior Publication Data

US 2003/0038375 A1 Feb. 27, 2003

(30) Foreign Application Priority Data

Aug. 21, 2001 (TW) ........................................ 90120462 A

(51) Int. Cl.⁷ ............................................... H01L 23/48
(52) U.S. Cl. ...................... 257/782; 257/783; 257/753; 438/119
(58) Field of Search ................................ 257/753, 783, 257/782, E23.027, E23.112; 438/119, 538, FOR 295

(56) References Cited

U.S. PATENT DOCUMENTS

| | | | | |
|---|---|---|---|---|
| 5,162,087 A | * | 11/1992 | Fukuzawa et al. | 252/500 |
| 5,180,888 A | * | 1/1993 | Sugiyama et al. | 174/94 R |
| 5,213,715 A | * | 5/1993 | Patterson et al. | 252/514 |
| 5,297,721 A | | 3/1994 | Schneider et al. | 228/180 |
| 5,571,340 A | | 11/1996 | Schneider et al. | 148/23 |
| 5,586,892 A | * | 12/1996 | Sato | 439/91 |
| 5,624,268 A | * | 4/1997 | Maeda et al. | 439/66 |
| 5,736,074 A | * | 4/1998 | Hayes et al. | 264/6 |
| 5,837,119 A | * | 11/1998 | Kang et al. | 205/74 |
| 5,965,064 A | * | 10/1999 | Yamada et al. | 252/512 |
| 6,214,636 B1 | * | 4/2001 | Sawayama et al. | 438/57 |
| 6,238,599 B1 | * | 5/2001 | Gelorme et al. | 252/514 |
| 6,265,085 B1 | * | 7/2001 | Watanabe et al. | 428/614 |
| 6,492,738 B2 | * | 12/2002 | Akram et al. | 257/783 |
| 2002/0005247 A1 | * | 1/2002 | Graham et al. | 156/291 |
| 2003/0080768 A1 | * | 5/2003 | Yamaguchi et al. | 324/768 |

FOREIGN PATENT DOCUMENTS

| | | | |
|---|---|---|---|
| JP | 406275123 | * | 9/1994 |
| JP | 411317426 A | * | 11/1999 |
| JP | 2003-126428 | * | 7/2002 |

* cited by examiner

*Primary Examiner*—Kamand Cuneo
*Assistant Examiner*—James M. Mitchell
(74) *Attorney, Agent, or Firm*—J. C. Patents

(57) ABSTRACT

A bonded anisotropic conductive film fabricated using a plastic material and a plurality of conductive particles inside the plastic material. The plastic material is a thermal set material hardening after being raised to a first temperature. Each conductive particle inside the plastic material includes a conductive bead, a bonding layer and a flux layer. The bonding layer is formed over the conductive bead enclosing the conductive bead entirely. The flux layer is formed over the bonding layer. The bonding layer has a melting point at a second temperature where the second temperature is higher than the first temperature.

10 Claims, 3 Drawing Sheets

BONDED ANISOTROPIC CONDUCTIVE FILM

CROSS-REFERENCE TO RELATED APPLICATION

This application claims the priority benefit of Taiwan application serial no. 90120462, filed Aug. 21, 2001.

BACKGROUND OF THE INVENTION

1. Field of Invention

The present invention relates to a bonded anisotropic conductive film. More particularly, the present invention relates to a bonded anisotropic conductive film for a flip chip package.

2. Description of Related Art

In this information explosion age, the market for multimedia is expanding at an ever-increasing rate. Integrated circuit packaging has to follow the market trends demanding for more digital equipment, networking, local area connections and customization. To meet such developmental trends, electronic devices must have high-processing, multi-functional, integrated capacity. Moreover, the devices must be light, compact and have a moderate to low price. Hence, miniaturization and high-level integration are the major driving forces behind the development of a new generation of integrated circuit packages. Ball grid array (BGA), chip-scale package (CSP), flip chip (F/C) and multi-chip module (MCM) are some of the high-density integrated circuit packages currently manufactured. Among these packages, flip chip occupies a relatively small area and accommodates a large number of leads. Inside flip chip, the lead wires are short, inductance is low and noise control is easy. Hence, most flip chips are used in high-end package products.

FIG. 1 is a schematic diagram showing a conventional method of using an anisotropic conductive film to electrically connect a silicon chip with a carrier. In most flip chips, input/output (I/O) contact points 102 on a silicon chip 100 and contact points 106 on a carrier 104 are electrically connected using an anisotropic conductive film (ACF) 108 as a medium. The anisotropic conductive film 108 is fabricated using a plastic material 109 and conductive particles 110. In general, the conductive particles 110 are formed using such material as gold (Au). Hence, when a pressure is applied to the silicon chip 100 and the carrier 104, the conductive particles 110 within the anisotropic conductive film 108 form an electrical connection linking the contact point 102 and the contact point 106. Since the conductive particles 110 within the anisotropic conductive film 108 are the medium for connecting up the contact points 102 on the silicon chip 100 with the contact points 106 on the carrier 104, resistance is usually high and reliability of the connection is usually low.

FIG. 2 is a cross-sectional view of a typical conductive particle inside a conventional anisotropic conductive film. As shown in FIG. 2, the structure of a conductive particle 110 inside an anisotropic conductive film 108 comprises a near spherical plastic bead 112 and a gold plated layer 114 over the plastic bead surface.

When an anisotropic conductive film is used as a medium for connecting contact points on the silicon chip 100 with contact points 106 on the carrier 104, pitch of the contact point 102 cannot be too small. This is because the gold plated layer 114 of the conductive particle 110 may lead to a short circuit between neighboring contact points. In general, pitch P between contacts 102 must be greater than five times the diameter D of the contact 102 to prevent any unexpected short circuit due to contact with a neighboring contact point. Hence, constrained by the intrinsic structure of the conductive particles within the anisotropic conductive film 108 (the gold coating 114 over the plastic bead 112), further reduction of pitch P between neighboring contact points 102 is restricted.

In brief, using a conventional anisotropic conductive film having conductive particles therein, reliability of electrical connection is low and resistance after connection is high.

SUMMARY OF THE INVENTION

Accordingly, one object of the present invention is to provide a bonded anisotropic conductive film capable of forming a conductive pathway between a silicon chip and a carrier through bonding such that electrical connectivity of the conductive path is more reliable and resistance of the conductive path is lower.

To achieve these and other advantages and in accordance with the purpose of the invention, as embodied and broadly described herein, the invention provides a bonded anisotropic conductive film. The conductive film is fabricated using a plastic material and a plurality of conductive particles inside the plastic material. The plastic material, for example, is a thermal set material hardening at a first temperature. Each conductive particle inside the plastic material includes a conductive bead, a bonding layer and a flux layer. The bonding layer is formed over the conductive bead enclosing the conductive bead entirely. The flux layer is formed over the bonding layer. The bonding layer has a melting point at a second temperature where the second temperature is higher than the first temperature.

The conductive particles inside the bonded anisotropic conductive layer of this invention have an electrically insulating outermost flux layer. The flux layer not only serves as an insulating layer, but also brings the minimum separation between contact points closer together. Furthermore, the flux layer also has the capacity to cleanup any impurities on the contact surface of the silicon chip or the carrier. Hence, the bonded anisotropic conductive film forms a better common metallic bonding with the contact points.

The bonded anisotropic conductive layer of this invention can be applied to the fabrication of a flip chip. A silicon chip, a carrier and a bonded anisotropic conductive film are provided. The bonded anisotropic conductive film is placed between the silicon chip and the carrier and a pressure is applied so that contact points on the silicon chip and contact points on the carrier contain some conductive particles. In the meantime, the bonded anisotropic conductive film is heated to a first temperature, after heating the plastic material within the bonded anisotropic conductive film is hardened. Thereafter, the bonded anisotropic conductive film is heated to a second temperature so that the regions between the contact points on the silicon chip and the contact points on the carrier contain conductive particles. Through these conductive particles, the silicon chip and the carrier are electrically connected via their respective contact points and common metallic bonds.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
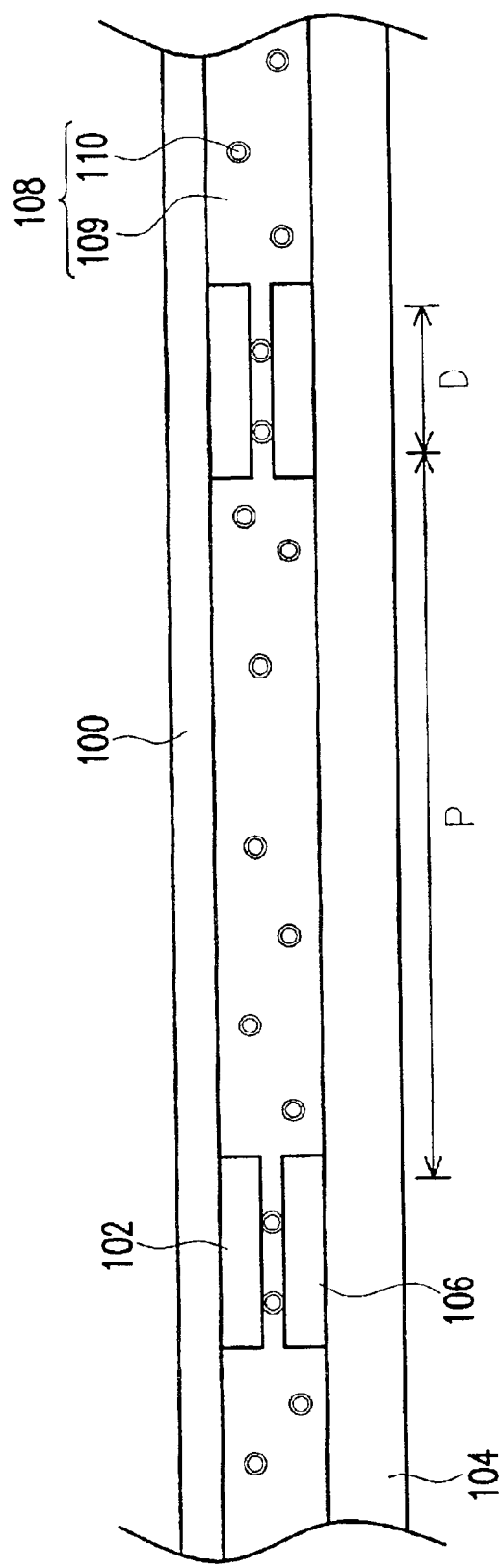
FIG. 1 is a schematic diagram showing a conventional method of using an anisotropic conductive film to connect a silicon chip with a carrier electrically.
Figure 2:
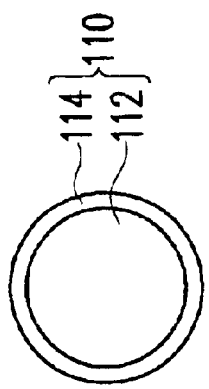
FIG. 2 is a cross-sectional view of a typical conductive particle inside a conventional anisotropic conductive film.

Reference will now be made in detail to the present preferred embodiments of the invention, examples of which are illustrated in the accompanying drawings. Wherever possible, the same reference numbers are used in the drawings and the description to refer to the same or like parts.

Figure 3:
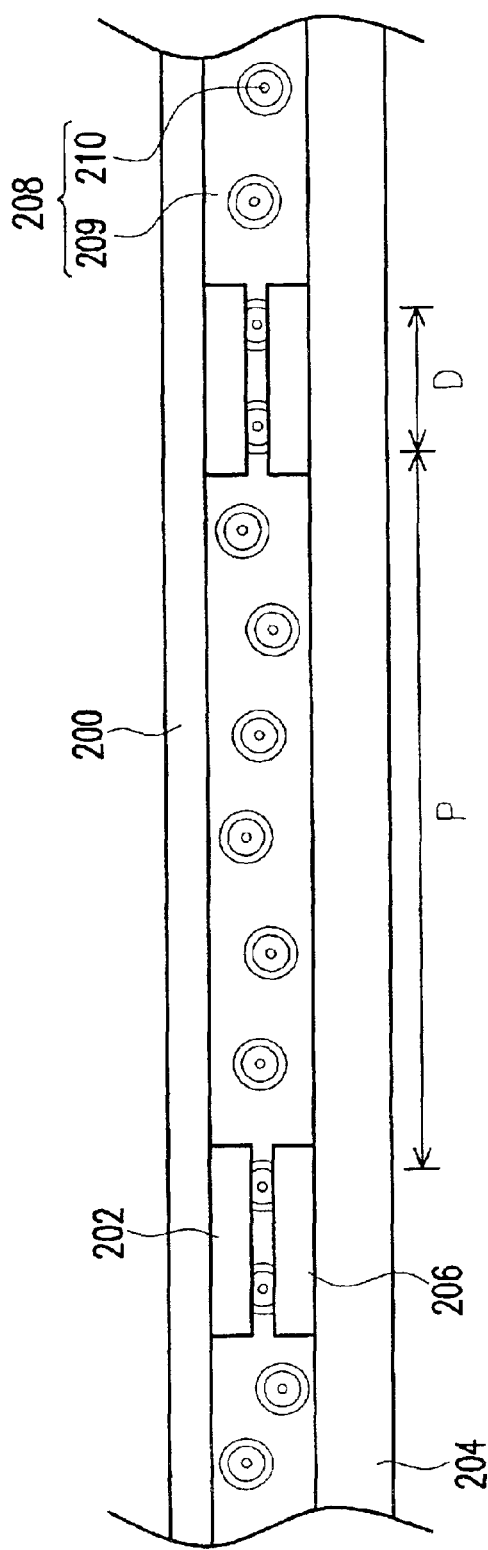
FIG. 3 is a schematic diagram showing an anisotropic conductive film serving as a medium for connecting a silicon chip with a carrier electrically according to one preferred embodiment of this invention.

FIG. 3 is a schematic diagram showing an anisotropic conductive film serving as a medium for connecting a silicon chip with a carrier electrically according to one preferred embodiment of this invention. In a flip chip package, contact points 202 on a silicon chip 200 and contact points 206 on a carrier 204 are connected using a bonded anisotropic conductive film 208 fabricated according to this invention to serve as a medium. The bonded anisotropic conductive film contains a plastic material 209 and a plurality of conductive particles 210. When a pressure is applied between the silicon chip 200 and the carrier 204, the bonded anisotropic conductive film between the contact points 202 and the contact points 206 is compressed. Due to compression, plastic material between the conductive particles 210 of the bonded anisotropic conductive film is squeezed and expelled from the sides so that the remaining conductive particles 210 in the gaps make contact with the contact points 202 and 206. Through the conductive particles 210, channel-like structures linking various contact points 202 and 206 are formed.

Figure 4:
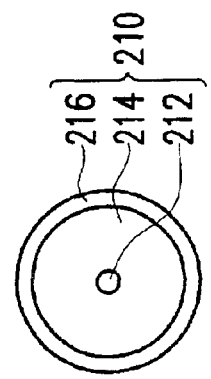
FIG. 4 is a cross-sectional view of a typical conductive particle inside an anisotropic conductive film according to the preferred embodiment of this invention.

FIG. 4 is a cross-sectional view of a typical conductive particle inside an anisotropic conductive film according to the preferred embodiment of this invention. The bonded anisotropic conductive film 208 according to this invention is fabricated using a plastic material 209 with numerous embedded conductive particles 210. The plastic material 209 can be a thermal set material that hardens at a first temperature, for example.

Each conductive particle 210, for example, comprises a conductive bead 212, a bonding layer 214 and a flux layer 216. The conductive bead can be spherical or any other shape. The bond layer 214 forms over the surface of the conductive bead 212 and encloses the conductive bead 212 entirely. The flux layer 216 forms over the bonding layer 214 and encloses the bonding layer 214 entirely. The conductive bead 212 is fabricated using a metallic material such as gold. The bonding layer 214 is formed from a material including lead-tin solder that melts at a second temperature. The second temperature is higher than the first temperature at which the plastic material 209 hardens. The flux layer 216 is formed from an electrically insulating flux material.

As shown in FIGS. 3 and 4, a pressure is applied to the silicon chip 200 and the carrier 204 so that the conductive particles 210 in the gap between the contact points 202 and 206 are compressed breaking their outermost flux layer 216. Once the outermost flux layer 216 of the conductive particles 210 is broken, the bonding material of the bonding layer 214 underneath the flux layer 216 is squeezed out. Hence, a conductive path is formed between the contact points 202 and 206 while other regions remain non-conductive. At this point, temperature is raised to the first temperature, for example, 150° C. to 160° C., after heating the plastic material 209 is hardened. The hardened plastic 209 fixes the conductive particles 210 in position.

The conductive particles 210 inside the bonded amsotropic conductive film 208 have an electrically insulating outermost flux layer 216. According to one aspect of the present invention, the flux layer 206, which is known in the conventional art to contain halide free and water soluble activators generally applied to the surfaces in the printed circuit board before soldering, is applied as an outermost layer of the conductive particles to function as a cleanser to cleanup impurities such as ions, grease and the like from the surface contacts of both the silicon chip 200 and the carrier 204, so that the electrical properties of the surface contacts can be substantially improved. Further, the flux layer 206 also contribute to the binding of the bonded anisotropic conductive film to contact point surface and forms common metallic bonds. In addition, the flux layer 216 being an insulator can also prevents short-circuiting of the contact points 202 and 206 with conductive particles 210 outside the bonding regions. Consequently, smallest permissible pitch between neighboring contact points can be reduced. In other words, neighboring contact points can be closer together.

Figure 5:
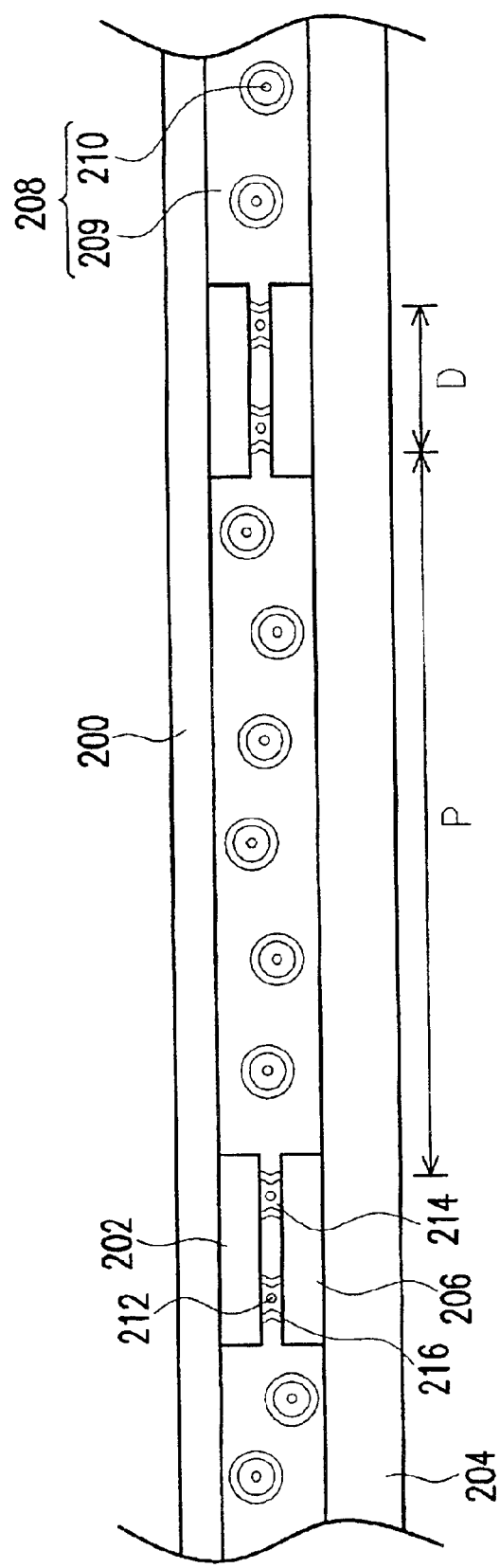
FIG. 5 is a cross-sectional view showing the formation of common metallic bonds between the contact points on the silicon chip and the contact points on the carrier according to this invention.

FIG. 5 is a cross-sectional view showing the formation of common metallic bonds between the contact points on the silicon chip and the contact points on the carrier according to this invention. In an alternative embodiment (not shown here), the conductive beads 212 may contact the contact points on the silicon chip and the carrier directly. After the application of a pressure to the silicon chip 200 and the carrier 204 and hardening the plastic material 209 through heating, the temperature of the bonded anisotropic conductive film is raised to a second temperature, for example, above 180° C. Thus, the conductive particles 210 within the plastic material 209 melt.

When the conductive particles 210 within the plastic material 209 are heated beyond the melting point, the conductive particles 210 may bond directly with the contact points 202 and 206 on the silicon chip 200 and the carrier 204. Since the conductive particles 210 outside the contact gaps are already set in position by the hardened plastic material 209, the conductive particles 210 remain in their original positions. Furthermore, since all the conductive particles 210 have an outer flux coating 216, the flux material is able to cleanup some of the impurities on the contact points 202 and 206 leading to the formation of good metallic bonds.

In conclusion, the bonded anisotropic conductive film according to this invention has the following advantages:

1. The outermost layer of the conductive particles within the bonded anisotropic conductive film is an electrically insulating flux material. The flux material facilitates the formation of common metallic bonds with contact points.

2. Since each conductive particle is enclosed by an insulating flux layer, short-circuiting between neighboring contact points can be prevented so that neighboring contacts may be closer and more compact circuits may form on the silicon chip.

3. The outer coating of the conductive particles breaks up to expose the conductive interior in the contact point gap regions through compression. Since a conductive channel is formed only in the compressed gap regions, reliability of the electrical connection is rather high.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bonded anisotropic conductive film, comprising:

a resin material; and a plurality of conductive particles dispersed in the resin material, wherein one or more conductive particles comprises a conductive bead including gold is encapsulated in a solder material covered with an outermost flux layer.

2. The bonded anisotropic conductive film of claim 1, wherein the solder material includes lead-tin alloy.

3. The bonded anisotropic conductive film of claim 1, wherein the resin material comprises a thermosetting resin.

4. A bonded anisotropic conductive film, comprising:

a plastic material; and a plurality of conductive particles within the plastic material, wherein each conductive particle has a conductive bead including gold, a bonding layer encapsulating the conductive bead and an insulating layer covering the bonding layer forming an outermost covering layer of the conductive bead, wherein the bonding layer is comprised of a lead-tin alloy.

5. The bonded anisotropic conductive film of claim 4, wherein the plastic material includes a thermal set material.

6. The bonded anisotropic conductive film of claim 4, wherein the plastic material hardens alter being raised to a first temperature and the bonding layer melts at a second temperature such that the second temperature is higher than the first temperature.

7. A flip chip package having a bonded anisotropic conductive film structure in any one of the claims from 4 to 6, comprising:

a silicon chip, a carrier and a bonded anisotropic conductive film, wherein the silicon chip has a plurality of first contact points thereon and the carrier has a plurality of contact points thereon that correspond in position to the first contact points, the bonded anisotropic conductive film is inserted between the silicon chip and the carrier such that each pair of corresponding first contact point and second contact point form a common metallic bond through the bonding layer of conductive particles within the bonded anisotropic conductive film.

8. A bonded anisotropic conductive film, comprising:

a plastic material; and a plurality of conductive particles within the plastic material, wherein each conductive particle has a gold bead, wherein one or more conductive particles are encapsulated by a bonding layer and an insulating layer covers the bonding layer forming an outermost covering layer, wherein the bonding layer is comprised of a lead-tin alloy.

9. The bonded anisotropic conductive film of claim 8, wherein the plastic material includes a thermal set material.

10. The bonded anisotropic conductive film of claim 8, wherein the plastic material hardens after being raised to a first temperature and the bonding layer melts at a second temperature such that the second temperature is higher than the first temperature.

* * * * *